US005828267A

United States Patent [19]
Loeffler

[11] Patent Number: 5,828,267
[45] Date of Patent: Oct. 27, 1998

[54] AMPLIFIER

[75] Inventor: Dirk Loeffler, Brahmenau, Germany

[73] Assignee: LDT GmbH & Co. Laser-Display-Technologie KG, Gera, Germany

[21] Appl. No.: 716,153

[22] PCT Filed: Jan. 11, 1996

[86] PCT No.: PCT/EP96/00108

§ 371 Date: Sep. 12, 1996

§ 102(e) Date: Sep. 12, 1996

[87] PCT Pub. No.: WO96/22631

PCT Pub. Date: Jul. 25, 1996

[30] Foreign Application Priority Data

Jan. 17, 1995 [DE] Germany .................. 195 01 236.4

[51] Int. Cl.[6] .................................................. H03F 3/68
[52] U.S. Cl. ...................................... 330/124 R; 330/84
[58] Field of Search ............................. 330/84, 107, 109, 330/124 R, 255

[56] References Cited

U.S. PATENT DOCUMENTS

| | | | |
|---|---|---|---|
| 4,321,552 | 3/1982 | Franssen et al. | 330/84 X |
| 4,366,441 | 12/1982 | Nishimura | 330/51 |
| 4,571,554 | 2/1986 | Martin et al. | 330/252 |
| 5,166,635 | 11/1992 | Shih | 330/84 X |
| 5,315,267 | 5/1994 | Chambers | 330/275 |

FOREIGN PATENT DOCUMENTS

| | | |
|---|---|---|
| 2667744 | 4/1992 | France . |
| 4136314 | 8/1992 | Germany . |

OTHER PUBLICATIONS

JP 59–107615 (A) Patent Abstracts of Japan, Sec. 1, V.8 (1984) No. 226 (E–272).
JP 59–146207 (A) Patent Abstracts of Japan, Sec. 1, V.8, (1984) No. 277 (E–285).
JP 4–172804 (A) Patent Abstracts of Japan, Sec. 1, V. 16 (1992) No. 478 (E–1274).
JP 52–19051 (A) Patent Abstracts of Japan, Sec. 1.
R. Graf, "TheModern amplifier Circuit Encyclopedia", TAB Books, Blue Ridge Summit, PA, 1992, p. 29.
8140 Electronics World + Wireless World 97 (1992)May, # 1674, Sutton, Surrey, GB (Putting Mic Amplifiers on the Line / pp. 402–405).
8172 IEEE International Solid–State Circuits Conference, 35(1992) Feb., New York, US (A Compact Bipolar Class AB Output Stage Using 1V Power Supply / pp. 194–194 & 280).
1987 IEEE International Conference on Consumer Electronics, Digest of Technical Papers, Jun. 2–5, 1987 (Componentless Audio Power Integrated Circuit for Car Radio Applications / pp. 252–253).
Patent Abstracts of Japan, Mar. 19, 1990, vol. 4 No. 32 (E–2) (514) Japanese Application No. 55–5559 16JAN80 (Fujitsu K.K.).

*Primary Examiner*—Steven Mottola
*Attorney, Agent, or Firm*—McAulay Fisher Nissen Goldberg & Kiel, LLP

[57] ABSTRACT

In an amplifier which generates an output voltage which is proportional to an input voltage and can be picked off between the outputs of two push-pull output stages and has peak-to-peak values of up to twice the supply voltage of the push-pull output stages, each push-pull output stage is driven by a differential amplifier having a positive and a negative differential input in each instance and whose polarity is so defined that the outputs of the two push-pull output stages have voltages of like polarity when identical voltages are present between the positive and negative differential inputs of the two differential amplifiers, a differential input of one differential amplifier being connected with a differential input of like polarity of the other differential amplifier. The remaining two differential inputs of the differential amplifiers are provided for applying a voltage proportional to the input voltage.

12 Claims, 3 Drawing Sheets

AMPLIFIER

BACKGROUND OF THE INVENTION a) Field of the Invention

The invention is directed to an amplifier which generates an output voltage which is proportional to an input voltage and can be tapped between the outputs of two push-pull output stages and has peak-to-peak values of as much as twice the supply voltage.

b) Description of the Related Art

In order to modulate the light intensities of lasers, voltages of several hundred volts are required to drive a substantially capacitive load of 100 pF. When lasers are used in video technology to illuminate a television screen, an amplifier driving the modulator must have a wide bandwidth of up to 30 MHz in addition to the required high output voltage.

Conventional amplifiers using discrete semiconductor components are known in various circuit arrangements. For instance, semiconductor amplifiers are commonly used as cascode amplifiers, transimpedance amplifiers and differential amplifiers. However, these amplifiers are limited with respect to the output voltage and bandwidth which can be achieved.

On the other hand, tube amplifiers having a large bandwidth and also sufficiently high output voltages are available. However, the technical cost is also proportionately high. In addition, high-quality amplifiers also require considerable space to accommodate the tubes and cooling means for the latter, so that this type of amplifier is not suitable for home video equipment with laser sources. In particular, the space requirement in color video equipment in which three lasers of different colors must be driven in order to mix the colors to be shown is not practical.

Thus, for a commercial color video device it is only practical to use semiconductor amplifiers. However, currently available transistors with breakdown voltages greater than 300 V cannot be used to drive the modulators directly, since the parasitic capacitances limit the limiting frequency to approximately 15 MHz as is indicated, for example, in the book "Transistoren-Kurztabelle" by Hans Guinther Steidle, Franzis-Verlag, Munich, 1989, and similar tables. An additional problem is caused by the required rupture capacity, since the impedance at 30 MHz and 100 pF is less than 100 Ω.

On the other hand, there are enough known transistor types with limiting frequencies of more than 100 MHz for breakdown voltage greater than 150 V and less than 300 V, such as the 2SA639S or 2SA 913, both of which have limiting frequencies of 130 MHz. The latter transistor can even handle power losses of 15 W. However, because of the required output voltage of greater than 150 V, the modulators cannot be driven directly by these transistors.

A problem of a similar nature occurred with air-core or transformerless low-frequency amplifiers in the sixties, when transistors were available with high output but with breakdown voltages of only up to 30 V. This was remedied by switching the load between two push-pull output stages, one of which was driven in opposite phase to the other. In this way, it was possible to achieve double the voltage swing given by the supply voltage.

Such amplifiers with two push-pull output stages in which the load is operated between the outputs are known, e.g., from DE-AS 20 61 943 and DE-OS 24 31 485. DE-AS 20 61 943 describes a differential amplifier in which the negative branch of the first push-pull output stage is connected with the positive branch of the second push-pull output stage and vice versa. DE-OS 24 31 485 shows circuits in a number of embodiment examples in which the polarity reversal of one push-pull output stage is produced for the other push-pull output stage by means of an inverting amplifier.

For high frequencies, however, the use of such amplifiers is limited, since the capacitance at the point where the input of the amplifier is connected is increased and the limiting frequency is accordingly reduced owing to the parallel connection of the amplifier needed to reverse polarity. This problem could be bypassed by driving at suitably low impedance at this point. However, this unnecessarily increases the power consumption of the circuit.

OBJECT AND SUMMARY OF THE INVENTION

In reference to the above, the present invention has the primary object of providing a broadband amplifier with high output voltage which transmits signals of up to several megahertz and which can also drive predominantly capacitive loads.

This object is met, according to the invention, in an amplifier of the type mentioned above in that each push-pull output stage is driven by a differential amplifier having a positive differential input and a negative differential input in each instance and whose polarities are so defined that the outputs of the two push-pull output stages have voltages of like polarity when identical voltages are present between the positive and negative differential inputs of the two differential amplifiers, wherein a differential input of one differential amplifier is connected with a differential input of like polarity of the other differential amplifier and the remaining two differential inputs of the differential amplifiers are provided for applying a voltage proportional to the input voltage.

The output voltage of the amplifier according to the invention is accordingly increased in that it is generated by the outputs of two push-pull output stages which are operated in opposite phase. Therefore, given a 150-V supply voltage of the amplifier, a voltage regulation of ±50 V can be achieved, that is, a voltage swing of 300 V is possible. The opposed polarities for the push-pull output stages are produced by two differential amplifiers whose inputs are connected in series according to the invention. Thus, compared with a parallel connection, there is only ¼ of the capacitance at the point from which the voltages for driving the two push-pull output stages are subsequently treated with different polarities. This means that the limiting frequency which is limited at this point of the circuit by internal capacitances is increased fourfold.

The design of a broadband amplifier for high frequencies according to the prior art is known to persons skilled in the art. What was not previously known is that the point mentioned above negatively affects the high-frequency behavior and a remedy is provided by a simple series connection instead of a parallel connection as in the prior art. With this teaching and other knowledge of the art, the person skilled in the art can realize broadband amplifiers with high frequencies and high voltage.

In the amplifier according to the invention, the input capacitance is not only reduced compared with an individual amplifier, but is even advantageously decreased by half This advantageous characteristic was not to be expected from the statement of the object of the invention and is purely a result of the special solution to connect the inputs of two differential amplifiers in series.

According to a preferred further development of the invention, the desired frequency-independent amplification is ensured in that the amplification of at least one of the push-pull output stages and/or of the differential amplifier driving it is decreased to a lower overall amplification by means of negative feedback.

The negative feedback thus determines the level of amplification for all frequencies in which the amplification without negative feedback is substantially greater than the amplification determined by the negative feedback. This means that the frequency response of the amplifier is substantially independent from the components utilized in this amplifier. However, this only applies to frequencies below the attainable limiting frequency at which the negative feedback becomes ineffective due to the lower amplification of the semiconductor components.

In terms of circuitry, negative feedback can be realized in a variety of ways by the interconnection of resistors, capacitors and coils. However, in an amplifier according to the invention, the amplification should be as constant as possible over a broad frequency band. This can be achieved in various ways by means of appropriate dimensioning of RC networks in that a possible drop in amplification due to input impedance or an impedance at the point at which the negative feedback is tapped is compensated for by the design of the negative feedback.

Since the input capacitances should be kept very small, the input impedance is essentially resistive. Thus, the negative feedback voltage could be tapped from the output of the push-pull output stage by a simple resistor. This is problematic in the case of capacitive loads. Output current and output voltage are not in phase. The high currents which occur for this reason can load the output to the extent that these currents feed back to the input via the negative feedback in a partial frequency range. This reaction can be suppressed by an appropriately low-impedance design of the amplifier output, but the output stage then consumes a corresponding amount of power.

According to a preferred further development, however, the output is prevented from feeding back to the input in that a differential input of a differential amplifier is negatively fed back via a resistor with a voltage proportional to the input voltage, this voltage being tapped upstream of the push-pull output stage.

In this case, the input impedance itself can be real and the frequency-independent amplification is practically only dependent on the resistance values of the negative feedback resistor and another resistor in the input. Since the negative feedback is tapped upstream of the push-pull output stage rather than directly at the output, the feedback of the phase displacement due to the capacitive load to the input is substantially suppressed without necessitating a correspondingly low-impedance design of the output. Thus, this further development economizes on power and, as a result of the purely resistive negative feedback, also enables a purely real input impedance which is advantageous for high frequencies.

With negative feedback, the amplification only remains constant up to a frequency at which the amplification of the amplifier itself is less than the amplification adjusted by the negative feedback. At higher frequencies, the amplification drops sharply as the frequency increases.

According to an advantageous further development of the invention, this drop in amplification in relation to frequency is mitigated in that the negative feedback is effected via series-connected resistors or via an individual resistor and a phase-shifting component such as a choke or a capacitor is provided at a tap of the series connection of resistors or is connected in parallel to a resistor which is so connected that the negative feedback is reduced in the vicinity of the limiting frequency of the amplifier.

As a result of the reduced negative feedback, the maximum frequency at which the amplifier can be operated so as to be practically independent from frequency is increased. Moreover, because of the change in phase position by means of phase-shifting components, a positive feedback can be achieved instead of a negative feedback at very high frequencies so that the amplification is even increased via a feedback of this kind compared to the amplifier operated without negative feedback, which can be used, in addition, to extend the cutoff at which the amplification drops.

According to a preferred further development of the invention, the differential amplifiers are operational amplifiers. In this further development, the differential amplifiers have a very high input resistance and a high gain so that the input resistance and the desired amplification of the amplifier can be adjusted practically exclusively through the external wiring. In this way, among other benefits, the input of the amplifier can be designed with a particularly favorable low impedance, which is especially advantageous for high frequencies and for preventing interference.

Operational amplifiers for various limiting frequencies, voltages and outputs are commonly used at present in electrical engineering. As integrated circuits, they are even among those standard components which can be obtained at a low price owing to the high piece numbers manufactured. Accordingly, an amplifier according to the invention which has these components can be produced particularly inexpensively.

In commercially available integrated operational amplifiers, the input capacitances which take part in substantially determining the limiting frequency must be taken into consideration in the same way as with the interconnected transistors. The price of operational amplifiers increases sharply as the input capacitances decrease. Since the input capacitance is substantially reduced as a result of the series connection of the amplifiers, the cost of an amplifier according to the invention is advantageously lower than that of a high-frequency amplifier constructed according to the prior art. The amplifier according to the invention is therefore affordable for the consumer electronics market and the use of such amplifiers in laser video technology will allow good-quality large projection television in households in the near future.

According to a preferred further development of the invention, the operational amplifiers are so connected that the input voltage can be applied between a positive differential input of an operational amplifier and zero potential of the amplifier and a low-impedance terminating resistor at zero potential is provided at the input for the input voltage.

In this circuit arrangement, no current is drawn from the signals present at the input side for operating the operational amplifier since the high input resistance of an operational amplifier takes effect at the input due to the positive differential input. However, in order to provide a low-impedance input which is advantageous for high frequency, a low-impedance terminating resistor is provided.

With respect to circuitry, this has the advantage that the amplifier is completely uncoupled with respect to current from the generation of the signals to be amplified. Current from a circuit for generating input signals only flows over the terminating resistor and back again. Input currents along the voltage supply lines do not occur in this circuit. Accordingly, the amplifier is not sensitive to grounding errors.

However, the exclusively potential-oriented coupling of the operational amplifier input to the terminating resistor could promote interference on the input side. In the embodiment mentioned above, this is prevented by means of a low-valued terminating resistor by means of which possible interference in the input of the amplifier is short-circuited. A terminating resistance of 50 Ω is recommended for this purpose.

In order to achieve the greatest possible voltage swing at the output of the amplifier, the quiescent voltage, i.e., the output voltage at zero input voltage, of the two push-pull output stages is adjusted to exactly half of the maximum supply voltage. This condition can be met with precision in mass production by using components with small tolerances, but this adds unnecessarily to the cost of the amplifier according to the invention. This is why, in the prior art, components with lower tolerances are conventionally used and the desired quiescent voltages are adjusted at determined points of the circuit by trimmer potentiometers.

However, trimmer potentiometers are poorly suited to high-frequency amplifiers due to their high capacitances and internal inductances. Further, adjustment is made more difficult through the use of improper tools, e.g., a screwdriver with a metal tip, since this can also act as an antenna and can cause high-frequency interference during adjustment. Adjustment problems of this nature are familiar to the person skilled in the art in practice.

According to another preferred further development of the invention, these difficulties are prevented by an adjustable current source and/or an adjustable voltage generator, by means of which DC voltage components can be added to or subtracted from the output voltages of the push-pull output stages.

The output voltages of differential amplifiers can be changed by current sources and voltage generators. Current sources and voltage generators are advantageously extensively uncoupled from the rest of the components of the amplifier so that possible interference is short-circuited in terms of high frequency during adjustment at correspondingly high output capacitances of the current source and/or voltage generator.

Internal resistances of the voltage generator and/or current sources themselves also have little effect on the high-frequency behavior of an amplifier if they are uncoupled from the rest of the amplifier by parallel capacitors or coils in series connection as is known from the prior art, since only the DC voltage component is essential for the adjustment in question.

For example, a suitable, simple current source is preferably a high-value resistor connected to a supply voltage. A simple voltage divider can be provided as a voltage generator. An inductor can be provided for decoupling the high frequency from the current source, while the voltage divider can be kept stable with respect to direct current by means of a capacitor.

However, it has been shown in practical video applications that an inductor can be dispensed with in the current generator because the line inductances in the circuit construction which are inevitable at the high frequencies of 30 MHz mentioned above are effective for coupling out the high frequency.

When both a current source and a voltage generator are used, according to an advantageous further development of the invention, wherein the adjustable current source is connected to the interconnected differential inputs and the voltage of the adjustable voltage generator can be added to or subtracted from the input voltage, two parameters are available for adjustment, namely the adjustable current and the voltage. Two parameters in the amplifier can also be changed with these parameters. In the circuit mentioned above, these parameters are the two output voltages at zero input voltage of the push-pull output stages. This circuit has the advantage compared with an individual current source or an individual voltage generator that both push-pull output stages can be optimized with respect to quiescent voltage.

Further, the output voltages of the push-pull output stages can be adjusted independently from one another in a simple manner. That is, the output voltage of one of the push-pull output stages is independent from the current from the current source. This enables adjustment to be carried out in the following simple manner: The voltage at the push-pull output stage which is independent from the current of the current source is first fixed by adjusting the voltage generator. The voltage of the other push-pull output stage is then adjusted with the current of the current source.

This adjustment example shows the simplicity with which an optimum adjustment of the output voltages of the push-pull output stages can be effected with the circuit according to this embodiment. Only two quick adjustments are required. The amplifier can be manufactured economically as a result of the short period of time required for adjustment and, moreover, it is easy to service. For this reason, the amplifier can be used in a particularly advantageous manner for consumer applications such as in the home video area.

As was already described above, the amplifier is also to be used above all to drive lasers in the area of video technology. The modulators required for this purpose have an inner capacitance in the region of 100 pF. In order always to generate the same voltage at the capacitor in video applications for a defined black level, the load is advisably discharged from time to time to a defined value. For this purpose, in a preferred further development, a clamping voltage which can be applied in parallel to the load is provided at at least one output of a push-pull output stage and one or more coupling capacitors are provided whose overall capacitance exceeds the capacitance of a capacitive load which can be operated with an amplifier.

The adjustment of the defined capacitor charge is effected in this case by clamping. In order to discharge the amplifier when applying a clamping voltage, an additional capacitance is advantageously connected upstream of the load by means of coupling capacitors, which limits the reaction of quick voltage changes on the push-pull output stages. In order to prevent excessive attenuation of the maximum voltage to load outside the time period for clamping due to a voltage drop at the coupling capacitors, the capacitances of the latter are selected so as to be substantially greater than the capacitance of the capacitive load.

When the capacitance of the coupling capacitors is designed in such a way, according to a preferred further development, that the internal resistance of the push-pull output stage, together with the capacitance of the coupling capacitor connected to its output, is less than 1 $\mu$s, the clamping can also hold back the voltage at the capacitive load to the black level with sufficient accuracy during the time available in video systems for the line change.

Accordingly, the capacitance of the load and the internal resistance of the amplifier give an upper and a lower limiting value for the dimensioning of the coupling capacitors which should be taken into account by the person skilled in the art for the optimum design of an amplifier according to the invention with capacitive loads.

The invention is explained more fully with reference to embodiment examples in conjunction with the drawings.

DESCRIPTION OF THE PREFERRED EMBODIMENTS

Figure 1:
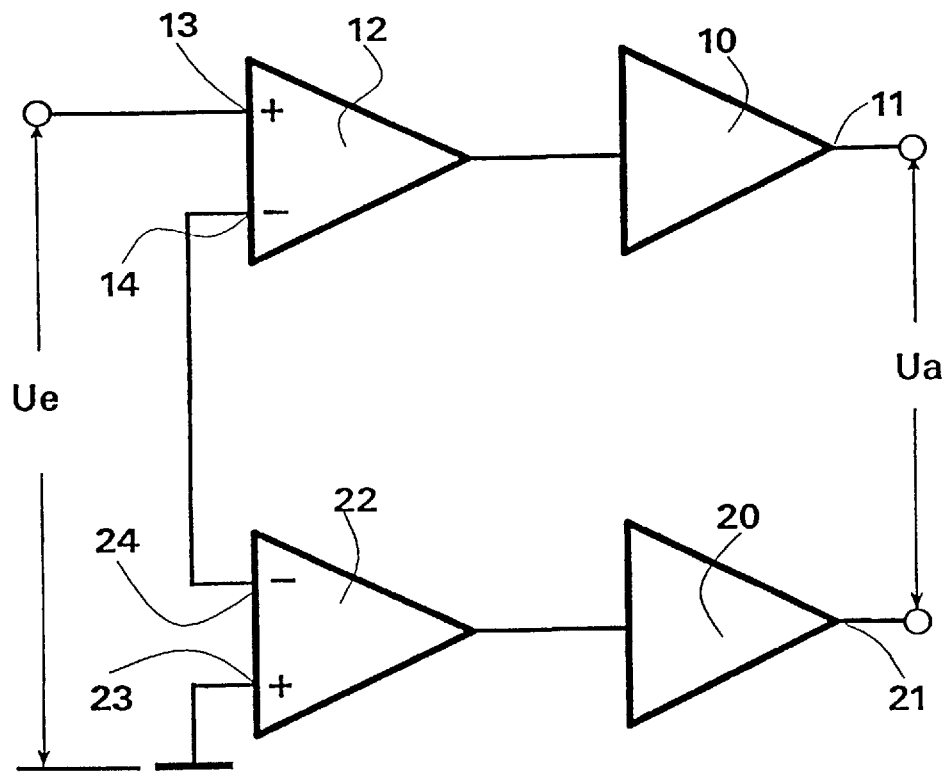
FIG. 1 shows a basic circuit of an amplifier according to the invention.

FIG. 1 shows the basic principle of an amplifier according to the invention. The circuit can be used in amplifiers for high output voltages and at high frequencies. An amplifier according to the invention can also have other components in addition to those shown in FIG. 1, such as a preamplifier, although the essential circuit features of FIG. 1 for high frequencies and high output voltages are used.

In the circuit shown in FIG. 1, the high output voltage, represented by Ua, is generated by two push-pull output stages 10 and 20 which are driven in opposite phase. The output voltage Ua is taken off between the outputs 11 and 21 of the push-pull output stages 10 and 20.

The output voltage of a push-pull output stage is usually defined by the supply voltage. In a laser video system, 180 V was selected as supply voltage for the amplifier driving a modulator. This means that with a single push-pull output stage 10 or 20, the voltage swing at a load at output 11 or 21 is only 180 V. However, since the load is applied between the outputs of two push-pull output stages, the total voltage range is ±180 V, that is, a total voltage swing of 360 V is available without having to design the end transistors in the push-pull output stages 10 and 20 for voltages higher than 180 V.

It is known from the prior art that push-pull output stages 10, 20 can be driven with opposite polarity in that an inverting amplifier and a noninverting amplifier pick off, at a point in the amplifier, a voltage proportional to an input voltage Ue and the voltages obtained via these amplifiers are supplied to the output stages with opposite polarity. However, a high capacitance occurs at the point where the inverting amplifier and noninverting amplifier are connected as a result of the parallel connection of the input capacitances, which attenuates the amplification at high frequencies.

In contrast, the signals of opposite polarity for driving the push-pull output stages 10 and 20 according to FIG. 1 are generated via two differential amplifiers 12 and 22, whose differential inputs 13, 14, 23 and 24 are connected in series. Thus, the input impedances of the differential amplifiers 12 and 22 are in series with respect to the input voltage Ue. As a result of this series connection, the input capacitance is reduced to one fourth compared with a parallel connection, resulting in improved transmission of higher frequencies.

In the circuit in FIG. 1, the input voltage Ue is at zero potential. The positive differential input 23 of the differential amplifier 22 is consequently likewise at zero.

The polarity shown in FIG. 1 serves only as an example, that is, a negative differential input could also be at zero potential and all polarities reversed. The circuit would exhibit the same high frequency behavior if all polarities were inverted.

The aforementioned series connection is realized in that the negative differential input 24 of differential amplifier 22 is connected with the differential input 14 of like polarity of differential amplifier 12. The input voltage Ue or a voltage proportional thereto is applied at zero potential to the other differential input 13 of the differential amplifier.

As a result of the series connection, the voltage Ue is divided into two partial voltages between the inputs of the differential amplifiers corresponding to the division of internal resistances. An additional resistor can be connected in parallel at the differential inputs 13, 14 and 23, 24 in order to achieve a division independently from the tolerances of the components in the input circuits of the differential amplifiers. At a desired terminal resistance of 50 Ω for the input voltage Ue, the value of these resistors will then be 25 Ω respectively. The numerical example shows that, as a result of the circuit, the input circuit of the differential amplifiers 12, 22 is designed with substantially lower resistance than is possible in the prior art. This also makes the circuit considerably better suited for high-frequency amplification than the known circuits.

Figure 2:
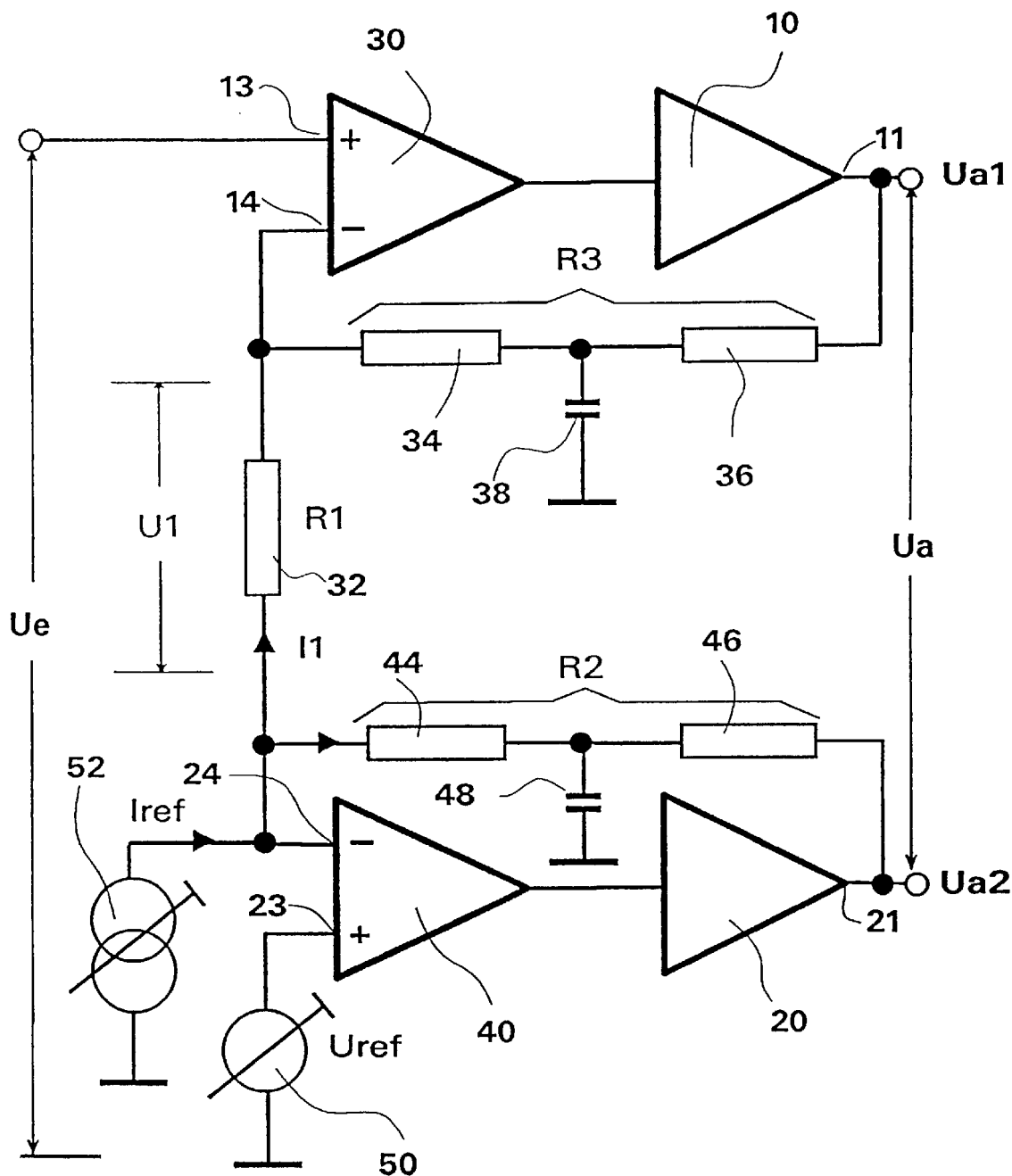
FIG. 2 shows an embodiment example with operational amplifiers as differential amplifiers which provides a simple adjustment of the quiescent potential at the push-pull output stages.

FIG. 2 shows a circuit design similar to the circuit shown in FIG. 1. The differential amplifiers 12, 22 have been replaced by suitably designed operational amplifiers 30, 40.

The balancing network or simulation of the differential amplifiers 12 and 22 comprises resistors 32, 34, 36, 44 and 46. Resistors 34 and 36 are used for the negative feedback of the amplifier branch from the operational amplifier 20 and the push-pull output stage 10. Resistors 44 and 46 are used for the negative feedback of the inverting amplifier branch from the operational amplifier 40 and the push-pull output stage 20. The resistor 32 replaces the resistor which is conventionally connected at zero potential in a basic circuit for operating an operational amplifier 30 as noninverting amplifier and also the conventional series resistor in a circuit of an operational amplifier 40 as inverting amplifier.

In the circuit shown in FIG. 2, all currents needed for operation are drawn from the outputs of the push-pull output stages 10 and 20 and from the neutral conductor of the circuit by the resistors 32, 34, 36, 44 and 46. No current, however, is supplied to the circuit from the input circuit for generating the voltage Ue, since voltage Ue is present at the positive input of the operational amplifier 30, that is, the very high input resistance of the operational amplifier 30 ensures that the input voltage Ue is only coupled to the input of the amplifier with respect to potential.

Therefore, interference in the neutral conductor due to different currents is not transmitted to the input circuit and grounding errors between the circuit generating the voltage Ue and the amplifier according to FIG. 2 have no practical effect.

The coupling in of high frequency at the high-impedance input can be avoided by a low-value terminal resistance, e.g., 50 Ω, in the input of the amplifier shown in FIG. 2.

This step, the currentless coupling of the input voltage Ue and the low-impedance terminal of the input voltage Ue, eliminates interference in the amplifier, which makes it especially suitable for high-frequency applications.

Further, the negative feedback networks have two capacitors 38 and 48 which reduce the negative feedback at high frequencies so that the dependence of amplification on frequency is reduced at high frequencies. Accordingly, the frequency which can be achieved at low frequencies is also achieved at very high frequencies in the neighborhood of the limiting frequency. When appropriately designed with a plurality of resistors and capacitors in the negative feedback network, a phase rotation of the fed back voltage can even be achieved at high frequencies so that the regenerative feedback acts as positive feedback, thereby extending the limiting frequency.

FIG. 2 also shows an adjustable voltage generator 50 and a current source 52 which are connected to the operational amplifier 40 and serve to adjust the output voltages of the push-pull output stages 10 and 20 to their outputs 11 and 21 so that the level produced between the outputs can make full use of the voltage range given by the supply voltage, as will be explained hereinafter.

Due to the high voltage amplification of operational amplifiers, the voltage between the differential inputs 13, 14 and 23, 24 can always be applied at zero in normal operation, that is, in the operating range in which no overdriving occurs. Further, due to the high input resistance, there is no current in the differential inputs 13, 14, 23 and 24 of the operational amplifiers 30 and 40. These two characteristics of operational amplifiers considerably simplify the design of a circuit according to FIG. 2.

As a result of the aforementioned characteristics, a voltage U1=Ue-Uref is applied to the resistor 32. Thus, if R1 represents the resistance value of resistor 32, a current I1 =(UeUref)/R1 flows through this resistor 32.

The current Iref from the current source 52 is divided into two currents, one flowing through resistor 32, the other through resistors 44 and 46. The total resistance of the resistors 44 and 46 for negative feedback is represented hereinafter by R2.

The current flowing through the negative feedback resistor R2 is Iref-I1 due to the current division. For the resulting voltage of an output voltage Ua2 at output 21 of the push-pull output stage 20, this gives the following:

$$Ua2=Uref+(Iref-I1)\times R2$$

$$Ua2=-Ue\times R2/R1+Uref\times(1+R2/R1)+R2\times Iref.$$

The first term in the equation contains the linear relationship between Ue and Ua2. The sign shows that the operational amplifier 40 is operated as inverting and, together with the push-pull output stage 20, has a total amplification of R2/R1.

The subsequent terms which are independent of Ue contain expressions with Uref and Iref, which shows that the output voltage Ua2 can be adjusted by means of the current source 52 as well as by means of the voltage generator 50.

On the other hand, the output voltage of the push-pull output stage 10 is independent from the current Iref Because of the high input resistance of the operational amplifier 30, the total current I1 also passes through the resistor 32 via resistors 34 and 36 which have a total resistance represented by R3. For the resulting voltage of an output voltage Ua1 at output 11 of the push-pull output stage 10, this gives the following:

$$Ua1=(R3+R1)I1+Uref=Ue\times(R3+R1)/R1-Uref\times R3/R1.$$

The first term also represents an amplification in this case, but by the factor (R3+R1)/R1. Further, the term which is proportional to the voltage Ue now has a positive sign, which describes the noninverting operation of the operational amplifier 30 together with the push-pull output stage 10. The second term in the equation which is independent from Ue is dependent only on Uref, but is independent from Iref.

The amplifier according to FIG. 2 can therefore be adjusted with respect to DC voltage in a particularly simple manner in that voltage Ua1 is first adjusted by Uref with a short circuited input and the output voltage Ua2 is then adjusted by regulating Iref Thus, the balancing of the amplifier is effected by means of only two adjustments.

As a result of the adjustment by means of a separate current source 52 and a separate voltage generator 50 instead of by internal resistors within the operational amplifiers 30, 40 or push-pull output stages 10 and 11, it is possible to couple out high frequency which could reach the amplifier during the adjustment, e.g., by means of interference via the adjusting tool. Such detuning cannot occur in the amplifier according to FIG. 2.

In order to improve the high-frequency decoupling, the current source 52 can also be applied to the operational amplifier 40 in series connection with an inductor. However, when the amplifier is designed in the range of several megahertz, the line inductances on the printed circuit board are sufficient in themselves for decoupling. The voltage generator 50 is decoupled with respect to high frequency by means of a parallel-connected capacitor.

In order to design the amplifier for the highest possible output voltage, the voltages Ua1 and Ua2 are adjusted to the mean voltage of the voltage supplying the push-pull output stage at Ue=0 and the amplification for the amplifier branch formed by the operational amplifier 30 and push-pull output stage 10 is selected equal to the amplification of the amplifier branch formed of the operational amplifier 40 and push-pull output stage 20, so that:

$$1+R3/R1=R2/R1.$$

Figure 3:
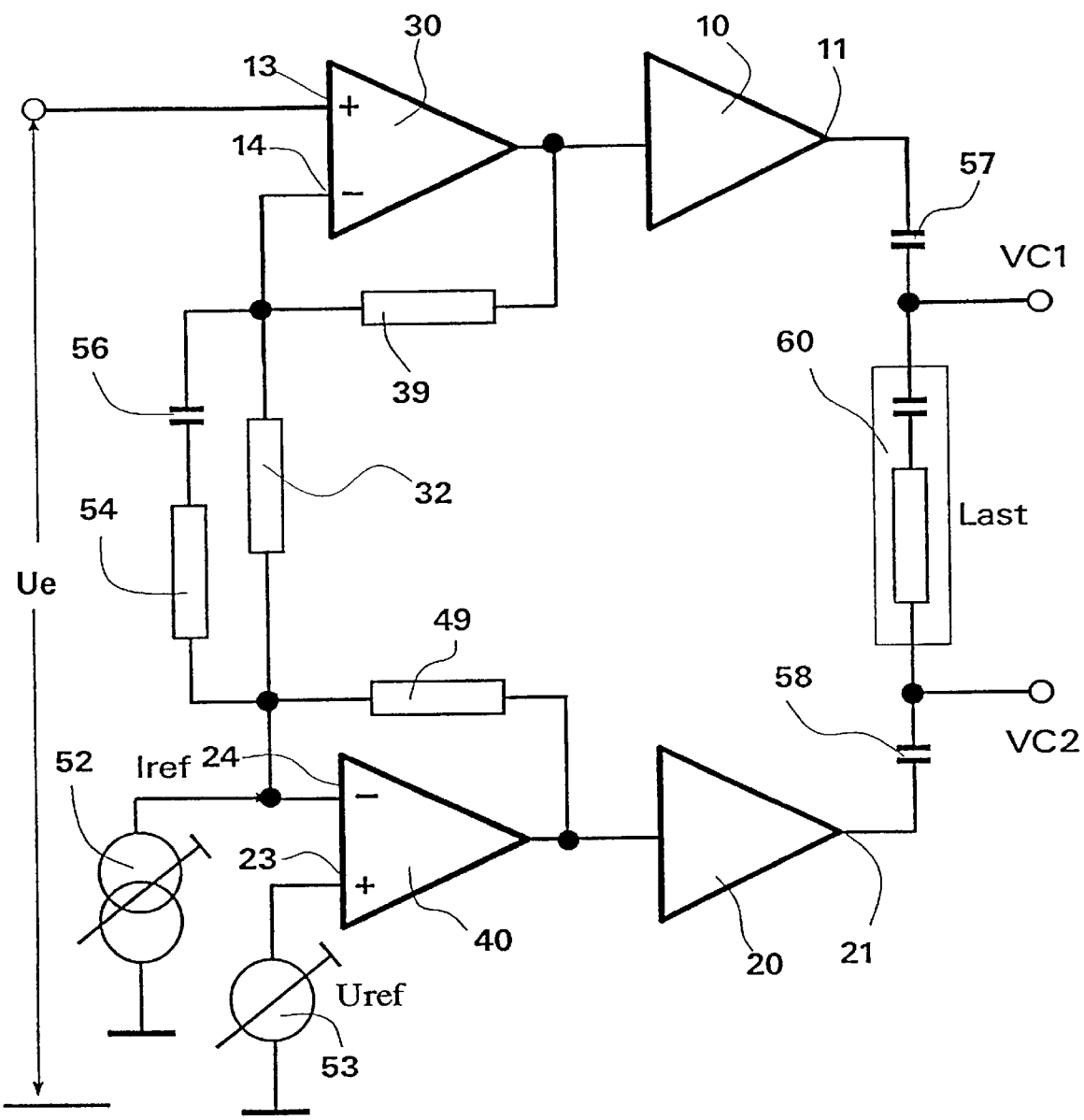
FIG. 3 shows an embodiment example similar to that shown in FIG. 2, but with circuit modifications for a particularly favorable driving of capacitive loads.

FIG. 3 shows a circuit similar to the circuit shown in FIG. 2. In this circuit, however, in contrast to that shown in FIG. 2, the negative feedback is no longer branched off from the output of the push-pull output stage. Rather, the output voltages required for the negative feedback are picked off between the operational amplifier 30 and the push-pull output stage 10 and between the operational amplifier 20 and the push-pull output stage 40 by means of resistors 39 and 49. Further, the increase in the maximum value of the frequency at which the amplification is still the same as that achieved at low frequencies is realized by means of a parallel connection of a resistor 54 with a series-connected capacitor 56 at resistor 32, instead of with capacitors 38 and 48 parallel to the negative-feedback resistor as in FIG. 2. This economizes on components since the capacitor 56 which takes effect at high frequencies need only be provided once for both branches.

The circuit according to FIG. 3 is particularly suitable for driving a capacitive load 60 which is shown in FIG. 3 by a series connection of a resistor with a capacitor. Capacitive loads must often be discharged in video applications in order to eliminate residual charge which would generate a value other than zero for black. This short circuiting, also referred to as clamping, is carried out at the end of every line during a time interval of less than 1 $\mu$s.

In the circuit according to FIG. 3, two voltages VC1 and VC2 can be applied directly to the load for this clamping. In order to decouple the push-pull output stages from the clamping process, two capacitors 57 and 58 are provided in FIG. 3 between the outputs 11, 21 of the push-pull output stages 10, 20 and load 60. The capacitances of the capacitors 57 and 58 are substantially greater than the capacitance of load 60 so that practically the entire available output voltage can be applied to the load 60 regardless of the capacitors 57 and 58.

In order to pull these capacitors 57 and 58 to a defined charge value during the clamping process, they must be discharged sufficiently quickly, that is, the time constant formed by the internal resistance of the push-pull output stages 10 and 20 and the capacitance of the capacitor 57 or 58 at the output 11 or 21 must be less than the available clamping time in the microsecond range. This condition, together with the requirement for a capacitance greater than that of the load 60, gives a lower and upper limit for the design of the capacitors 57 and 58.

In the embodiment example, capacitors with a capacitance of 100 nF are used for operating modulators for controlling the light intensity of a laser. The push-pull output stages contain three parallel-connected 2SC4623 transistors in the positive part and three parallel-connected 2SA1541 transistors in the negative part. All transistors were provided with a series-connected protective resistance of 33 Ω in the emitter, resulting in an internal resistance of less than 6 Ω for these push-pull output stages.

Thus, the clamping voltages VC1 and VC2 are fed back to the output voltages of the push-pull output stages 10 and 20 via the capacitors. For this reason, the negative feedback between the operational amplifiers 30, 40 and the push-pull output stages 10, 20 is advantageously taken off in a different manner than in the circuit according to FIG. 2 so that the application of clamping voltage cannot react on the input via the negative feedback.

The circuit according to FIG. 2 can also be used for clamping in that the input voltage Ue is clamped instead of the output voltage Ua. In addition, in order to generate the clamping voltage at the capacitive load 60, a switchable construction can then also be provided for the current source 52 and the voltage generator 50 which will then generate the desired values for the clamping voltage during clamping.

An amplifier according to FIG. 3 was used in video projection devices with modulated lasers. For this purpose, VPH05 type amplifiers were used to drive the end transistors of the push-pull output stage LT 1253 type amplifiers were used as operational amplifiers. Each of the resistors 38 and 39 had a value of 470 Ω and resistor 41 was formed by two resistors, each at 470 Ω, which were connected in series. The series connection of the resistor 54 and capacitor 56 which is effective at high frequencies was realized with 100 Ω and 15 pF.

Adjustable resistors were provided for the current source 52 and a voltage divider was provided for the voltage generator 53, both of them being supplied by the negative 15-volt supply voltage of the operational amplifiers 30 and 40. An additional capacitor of 100 nF was connected in parallel with the voltage divider to adjust the reference voltage Uref for high-frequency decoupling.

High-quality video pictures were successfully produced with this amplifier substantially as a result of the high frequencies which can be generated by the amplifier according to the invention notwithstanding the high voltages required for driving the modulators for controlling the intensity of the lasers.

While the foregoing description and drawings represent the present invention, it will be obvious to those skilled in the art that various changes may be made therein without departing from the true spirit and scope of the present invention.

What is claimed:

1. In an amplifier which generates an output voltage which is proportional to an input voltage and can be picked off between outputs of two push-pull output stages and has peak-to-peak values of up to twice a supply voltage of the push-pull output stages, an improvement comprising:

each push-pull output stage being driven by a differential amplifier having a positive and a negative differential input in each instance and whose polarities are so defined that the outputs of the two push-pull output stages have voltages of like polarity when identical voltages are present between the positive and negative differential inputs of the two differential amplifiers;

a differential input of one differential amplifier being connected with a differential input of like polarity of the other differential amplifier;

the remaining two differential inputs of the differential amplifiers being provided for applying a voltage proportional to the input voltage; and an adjustable current source and/or an adjustable voltage generator being provided, by which DC voltage components can be added to or subtracted from the output voltages of the push-pull output stages.

2. The amplifier according to claim 1, wherein the amplification of at least one of the push-pull output stages and/or of the differential amplifier driving the latter is decreased to a lower overall amplification by negative feedback means.

3. The amplifier according to claim 2, wherein at least one differential input of a differential amplifier is negatively fed back via a resistor with a voltage proportional to the input voltage, said voltage being tapped upstream of the push-pull output stage.

4. The amplifier according to claim 2, wherein the negative feedback means includes series-connected resistors, and a phase-shifting component is provided at a tap of the series connection of resistors, wherein said component is connected so that the amount of negative feedback is reduced in the vicinity of the limiting frequency of the amplifier.

5. The amplifier according to claim 1, wherein the differential amplifiers are operational amplifiers.

6. The amplifier according to claim 5, wherein the input voltage can be applied between a positive differential input of an operational amplifier and zero potential of the amplifier and a low-value terminating resistance at zero potential is provided at the input of the amplifier for the input voltage.

7. The amplifier according to claim 1, wherein an adjustable current source is connected to the interconnected differential inputs and the voltage of the adjustable voltage generator can be added to or subtracted from the input voltage.

8. The amplifier according to claim 1, wherein a clamping voltage can be applied in parallel to the load at at least one output of a push-pull output stage and one or more coupling capacitors are provided whose total capacitance exceeds the capacitance of a capacitive load which can be operated with the amplifier.

9. The amplifier according to claim 7, wherein a time constant given by the internal resistance at the output of a push-pull output stage, together with the capacitance of a coupling capacitor connected to its output, is less than 1 $\mu$s.

10. The amplifier according to claim 2, wherein the negative feedback means includes an individual resistor and a phase shifting component is connected in parallel to said resistor wherein said component is connected so that the amount of negative feedback is reduced in the vicinity of the limiting frequency of the amplifier.

11. The amplifier according to claim 4, wherein the shifting component is a component selected from a group consisting of a choke and a capacitor.

12. The amplifier according to claim 11, wherein the shifting component is a component selected from a group consisting of a choke and a capacitor.

* * * * *